United States Patent
Massoodi

(10) Patent No.: US 6,399,958 B1
(45) Date of Patent: Jun. 4, 2002

(54) APPARATUS FOR VISUAL INSPECTION DURING DEVICE ANALYSIS

(75) Inventor: Mohammad Massoodi, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/208,217

(22) Filed: Dec. 9, 1998

(51) Int. Cl.[7] .............................................. H01L 23/58
(52) U.S. Cl. ......................... 257/48; 257/684; 257/738; 257/749; 257/779
(58) Field of Search ................................. 257/737, 738, 257/749, 777, 784, 48, 684, 778, 779; 438/14, 15

(56) References Cited

U.S. PATENT DOCUMENTS

| | | | | |
|---|---|---|---|---|
| 4,692,387 A | * | 9/1987 | Reich | 428/545 |
| 5,148,103 A | * | 9/1992 | Pasiecznik, Jr. | 324/158 |
| 5,205,894 A | * | 4/1993 | Ohta et al. | 156/283 |
| 5,470,943 A | * | 11/1995 | Sakata et al. | 528/353 |
| 5,601,905 A | * | 2/1997 | Watanabe et al. | 428/215 |
| 5,767,528 A | * | 6/1998 | Sumi et al. | 257/48 |
| 5,869,887 A | * | 2/1999 | Urushima | 257/684 |
| 5,872,459 A | * | 2/1999 | Pasiecznik, Jr. | 324/765 |
| 5,969,088 A | * | 10/1999 | Ezzell et al. | 528/353 |
| 5,986,400 A | * | 11/1999 | Staring et al. | 313/503 |
| 6,127,729 A | * | 10/2000 | Fukuda | 257/736 |

FOREIGN PATENT DOCUMENTS

EP 709883 * 5/1996

* cited by examiner

Primary Examiner—Olik Chaudhuri
Assistant Examiner—Alonzo Chambliss
(74) Attorney, Agent, or Firm—Sawyer Law Group LLP

(57) ABSTRACT

Aspects for electrical trace inspection during device analysis for devices with solder ball attachments are described. In a method aspect, the method includes forming a desired integrated circuit device including bond wire attachments. The bond wire attachments are then utilized with electrical traces in a transparent tape layer, with visual inspection of the electrical traces performed through the transparent polyimide tape. In an apparatus aspect, the apparatus includes an integrated circuit die, the integrated circuit die including bond pads. The apparatus further includes bond wires coupled to the bond pads of the integrated circuit die, and a transparent tape layer, including a plurality of traces for electrically connecting to the bond wires, wherein visual inspection of the plurality of traces occurs through the transparent tape layer.

5 Claims, 2 Drawing Sheets

APPARATUS FOR VISUAL INSPECTION DURING DEVICE ANALYSIS

FIELD OF THE INVENTION

The present invention relates to integrated circuit device analysis, and more particularly to electrical trace inspection during device analysis for devices with solder ball attachments.

BACKGROUND OF THE INVENTION

With the advancements in semiconductor device technology, several different types of arrangements for integrated circuit devices have emerged. One arrangement involves the use of solder balls for attaching an integrated circuit device to a circuit board. Two examples of such devices are the fine-pitch ball grid array (FBGA) device and a micro ball grid array device ($\mu$BGA) device. FIGS. 1 and 2 illustrate a partial cross-sectional diagram of a typical FBGA device and a typical $\mu$BGA device, respectively.

As shown in FIG. 1, an FBGA device 8 typically includes an integrated circuit die 10 encapsulated in packaging material 12, e.g., an epoxy compound. Electrical connections for the die 10 are provided by bond wires 14, such as gold wires, coupling input/output pads on the die 10 to bond pads 16 of a die paddle 18, e.g., an elastomer material. The bond pads 16 electrically couple the die 10 to solder ball connectors 20 via traces 22, e.g., copper tracings, in a tape material 24, e.g., a polyimide tape. The solder ball connectors 20 capably attach the device 8 to a circuit board (not shown). As shown in FIG. 2, a $\mu$BGA device 30 includes an integrated circuit device 32 electrically coupled to solder balls 34 via bond wire 36 and trace 38. The trace 38 is provided in a polyimide tape 40. An elastomer seal layer 42 supports the coupling of the die 32 and bond wire 36 to the tape 40.

While the advent of such devices attempts to overcome certain challenges facing circuit designers, the needs of device analysis for these devices are usually overlooked in the design process. In analyzing integrated circuit devices, such as those shown in FIGS. 1 and 2, part of the procedure is to visually inspect the traces and solder ball connections. Unfortunately, the small size and large number of the traces makes visual inspection a challenging process. Further hampering the visual inspection process is the polyimide tape in which the traces are secured. Normal polyimide tape is provided as colored material, e.g., usually blue or brown. Such coloring reduces the clarity of the visual inspection process, thus limiting the ability to perform desired device analysis fully.

Accordingly, a need exists for a manner of providing more successful visual inspection during device analysis. The present invention addresses such a need.

SUMMARY OF THE INVENTION

The present invention provides aspects for electrical trace inspection during device analysis for devices with solder ball attachments. In a method aspect, the method includes forming a desired integrated circuit device including bond wire attachments. The bond wire attachments are then utilized with electrical traces in a transparent tape layer, with visual inspection of the electrical traces performed through the transparent polyimide tape. In an apparatus aspect, the apparatus includes an integrated circuit die, the integrated circuit die including bond pads. The apparatus further includes bond wires coupled to the bond pads of the integrated circuit die, and a transparent tape layer, including a plurality of traces for electrically connecting to the bond wires, wherein visual inspection of the plurality of traces occurs through the transparent tape layer.

Through the present invention, more efficient and accurate device analysis occurs. The utilization of a transparent polyimide tape layer provides a straightforward technique of improving clarity during visual inspection of electrical traces in integrated circuit devices, such as FBGA and $\mu$BGA devices. The improvement in clarity further reduces the time needed to inspect the traces and offers more reliable viewing of the traces. These and other advantages of the aspects of the present invention will be more fully understood in conjunction with the following detailed description and accompanying drawing

DETAILED DESCRIPTION

The present invention relates to electrical trace inspection during device analysis for devices with solder ball attachments. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
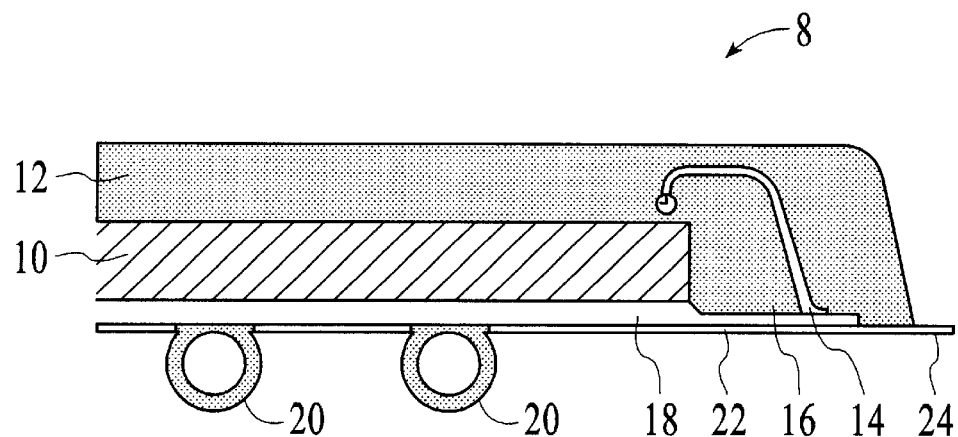
FIG. 1 illustrates a partial cross-section diagram of a typical FBGA device.
Figure 2:
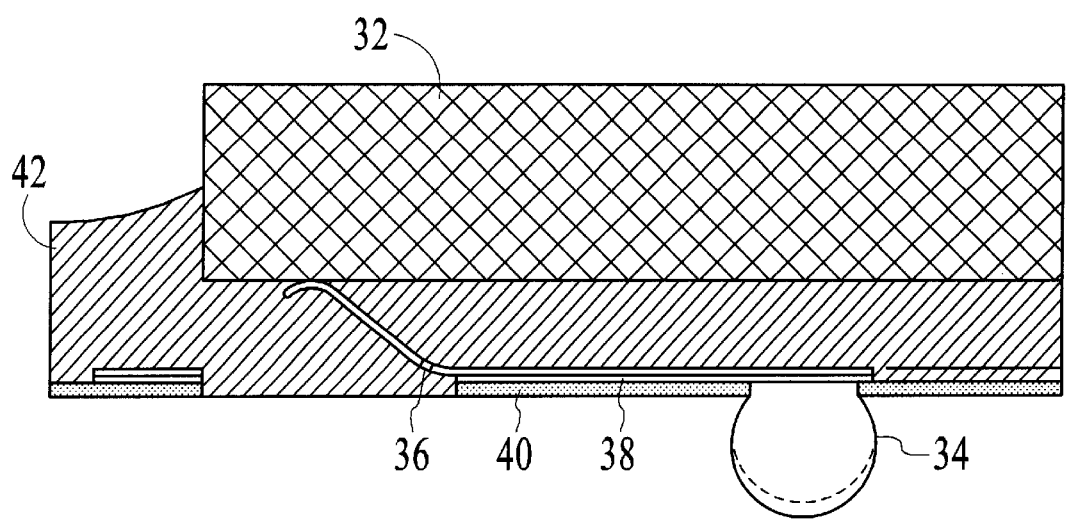
FIG. 2 illustrates a partial cross-section diagram of a typical $\mu$BGA device.
Figure 3:
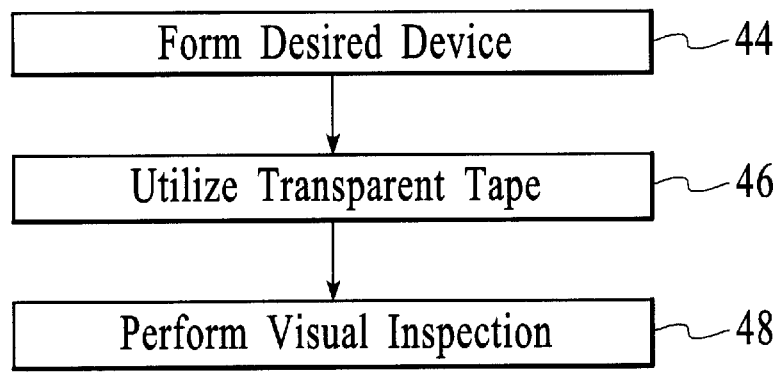
FIG. 3 illustrates a block flow diagram of a process for electrical trace inspection in accordance with the present invention.

FIG. 3 illustrates a block flow diagram of a process for electrical trace inspection in accordance with the present invention. The process initiates with formation of a desired device having bond wire attachments for use with solder ball electrical connections (step 44). For example, the desired device may be formed as an FBGA arrangement or a $\mu$GBA arrangement. While formation occurs according to known techniques, in contrast to prior art arrangements, however, a transparent polyimide tape is utilized to secure the copper traces (step 46). In a preferred embodiment, the transparent polyimide tape is transparent to light in an optical microscope. Device analysis is then performed. During the device analysis, a visual inspection is performed, e.g., with an optical microscope, (step 48) to identify problems in the traces. The transparent polyimide tape results in clearer and thus faster trace inspection, which results in better overall device analysis.

Figure 4:
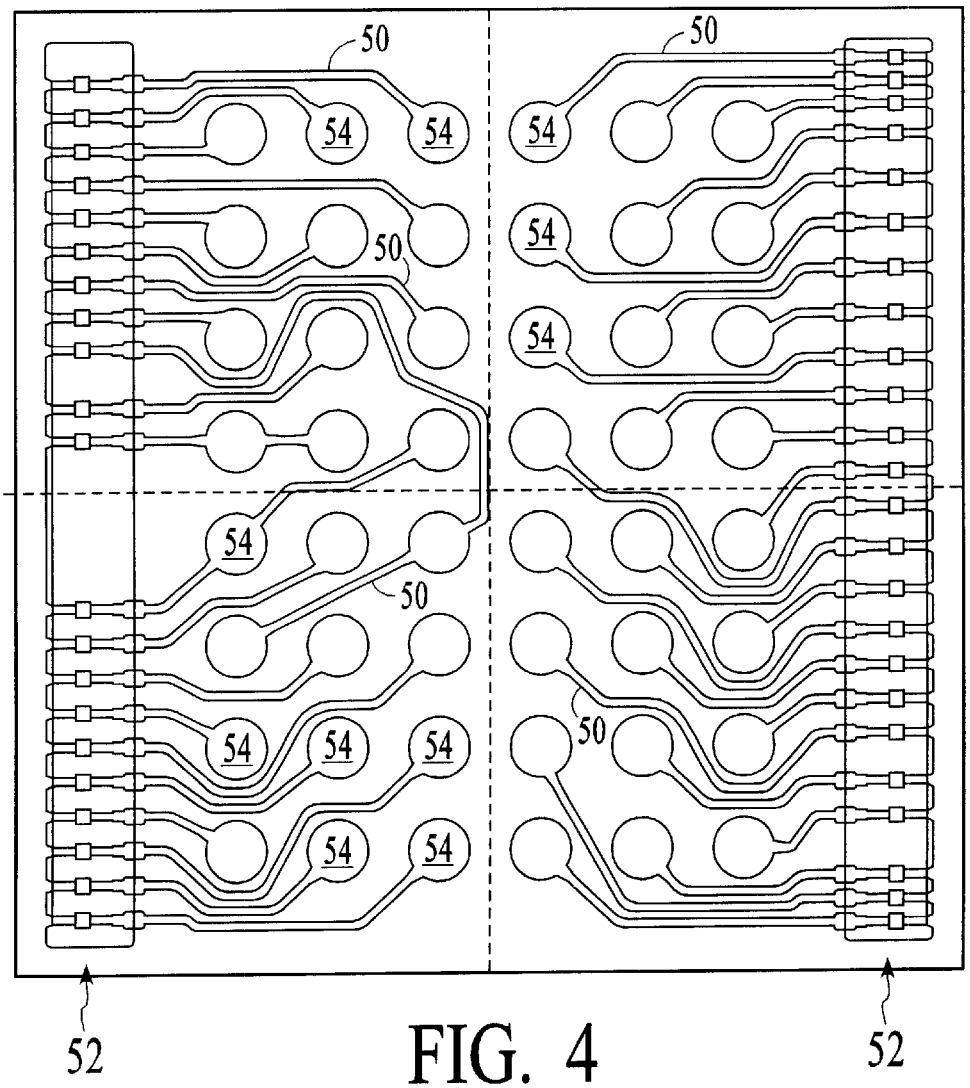
FIG. 4 illustrates a representation of potential traces for inspection according to the process of FIG. 3.

FIG. 4 illustrates an example of a trace layout of a FBGA device where utilization of transparent polyimide tape improves trace inspection. As shown in FIG. 4, a plurality of traces 50 couple each of a plurality of bond pads 52 to solder ball attachments 54. The apparent clarity of the traces 50 in the figure are representative of the clarity obtained during visual inspection when a transparent polyimide tape is utilized. With the small width and large number of traces in a given device, the improved clarity allows the variations in the path of the traces 50 to be followed more readily during inspection.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. An integrated circuit device apparatus with improved ability to visually inspect electrical connections, the apparatus comprising:

an integrated circuit die, the integrated circuit die including bond pads;

bond wires coupled to the bond pads of the integrated circuit die;

a transparent tape layer including a plurality of traces for electrically connecting to the bond wires, wherein visual inspection of the plurality of traces occurs through the transparent tape layer; and a plurality of solder balls coupled to the traces for attaching the integrated circuit die to a circuit board.

2. The apparatus of claim 1 further comprising an elastomer seal layer between the integrated circuit die and the transparent tape layer.

3. The apparatus of claim 1 wherein the transparent tape layer comprises a polyimide layer transparent to light of an optical microscope.

4. The apparatus of claim 1 wherein the integrated circuit die, bond wires, and transparent tape layer comprise elements of a fine ball grid array device.

5. The apparatus of claim 1 wherein the integrated circuit die, bond wires, and transparent tape layer comprise elements of a micro ball grid array device.

* * * * *